United States Patent [19]
Lakos et al.

[11] Patent Number: 6,064,806
[45] Date of Patent: May 16, 2000

[54] SYSTEM AND METHOD FOR CONVERTING A POLYGON-BASED LAYOUT OF AN INTEGRATED CIRCUIT DESIGN TO AN OBJECT-BASED LAYOUT

[75] Inventors: John Stuart Lakos, Basking Ridge; Richard Albert Eesley, Martinsville, both of N.J.

[73] Assignee: Mentor Graphics Corporation, Wilsonville, Oreg.

[21] Appl. No.: 08/943,395

[22] Filed: Oct. 3, 1997

Related U.S. Application Data

[60] Provisional application No. 60/027,768, Oct. 4, 1996.

[51] Int. Cl.[7] .................................................. G06F 17/50
[52] U.S. Cl. ...................................... 395/500.04; 716/11
[58] Field of Search ......................... 395/500.12, 500.09, 395/500.03, 500.08, 500.1, 500.11, 500.13, 500.04

[56] References Cited

U.S. PATENT DOCUMENTS

| | | | |
|---|---|---|---|
| 4,613,941 | 9/1986 | Smith et al. | 364/490 |
| 5,299,139 | 3/1994 | Baisuck et al. | 364/491 |
| 5,416,722 | 5/1995 | Edwards | 364/491 |
| 5,515,293 | 5/1996 | Edwards | 364/489 |
| 5,610,832 | 3/1997 | Wikle et al. | 364/491 |
| 5,612,893 | 3/1997 | Hao et al. | 364/491 |
| 5,618,744 | 4/1997 | Suzuki et al. | 438/599 |
| 5,621,653 | 4/1997 | Yuzawa | 364/491 |
| 5,625,568 | 4/1997 | Edwards et al. | 364/491 |
| 5,636,125 | 6/1997 | Rostoker et al. | 364/468.28 |
| 5,689,433 | 11/1997 | Edwards | 364/490 |
| 5,764,530 | 6/1998 | Yokomaku | 364/490 |
| 5,828,580 | 10/1998 | Ho | 364/489 |

FOREIGN PATENT DOCUMENTS

| | | | |
|---|---|---|---|
| 408235225A | 9/1996 | Japan | G06F 17/50 |
| 409185644A | 7/1997 | Japan | G06F 17/50 |
| 410269267A | 10/1998 | Japan | G06F 17/50 |

OTHER PUBLICATIONS

Jennings ("ICDS: a symbolic layout and mask verification system for VLSI", IEEE Proceedings of the 1980 Custom Integrated Circuits Conference, Jan. 01, 1980, pp. 101–102).

Moon et al. ("Circuit and Symbolic Extraction from VLSI Layouts of Arbitrary Shape", Journal of the Korean Institute of Telematics and Electronics, vol. 294, No. 1, pp. 48–59, Jan. 01, 1992).

Weste ("Mulga—An Interactive Symbolic Layout System for the Design of Integrated Circuits", The Bell System Technical Journal, vol. 60, No. 6, Jul. 1981, pp. 823–857).

Posluszny ("SLS: An Advanced Symbolic Layout System for Bipolar and FET Design", IEEE Transactions on Computer–Aided Design, vol. CAD–5, No. 4, Oct. 1986, pp. 450–458).

(List continued on next page.)

*Primary Examiner*—Paul R. Lintz
*Assistant Examiner*—Vuthe Siek
*Attorney, Agent, or Firm*—Klarquist Sparkman Campbell Leigh & Whinston

[57] ABSTRACT

A system and method is disclosed for converting a polygon-based layout in an integrated circuit to an object-based layout. In one aspect of the invention, a user-definable element set allows a user to program element types that are to be recognized. A candidate element type is chosen for recognition. A seed layer corresponding to the current element type is derived from the polygon-based view. The seed layer includes seed shapes. At least one of the seed shapes is analyzed to obtain its defining attributes. The attributes are used to configure a candidate element, which is an element type from the user-definable element set. The geometries of the candidate element are compared to corresponding geometries in a support view. If the geometries of the layers of the candidate element are entirely contained within the geometries on the respective layers of the support view, then the candidate element is considered recognized. The candidate element is then added to a recognized view. This process continues for substantially all of the seed shapes in the seed layer. Other candidate elements may then be used to further convert the polygon-based view to the object-based view.

23 Claims, 7 Drawing Sheets

OTHER PUBLICATIONS

U.S. application No. 08/943,666 having a title System and Method for Converting Polygon–Based Wires of an Integrated Circuit Design to Path–Based Wires, filed Oct. 3, 1997.

Lin et al., "A Circuit Disassembly Technique for Synthesizing Symbolic Layouts from Mask Descriptions," *IEEE Transactions on Computer–Aided Design*, 9:9, 959–969 (Sep. 1990).

Sawada, "A Hierarchical Circuit Extractor Based on New Cell Overlap Analysis," *IEEE*, pp. 240–243 (1990).

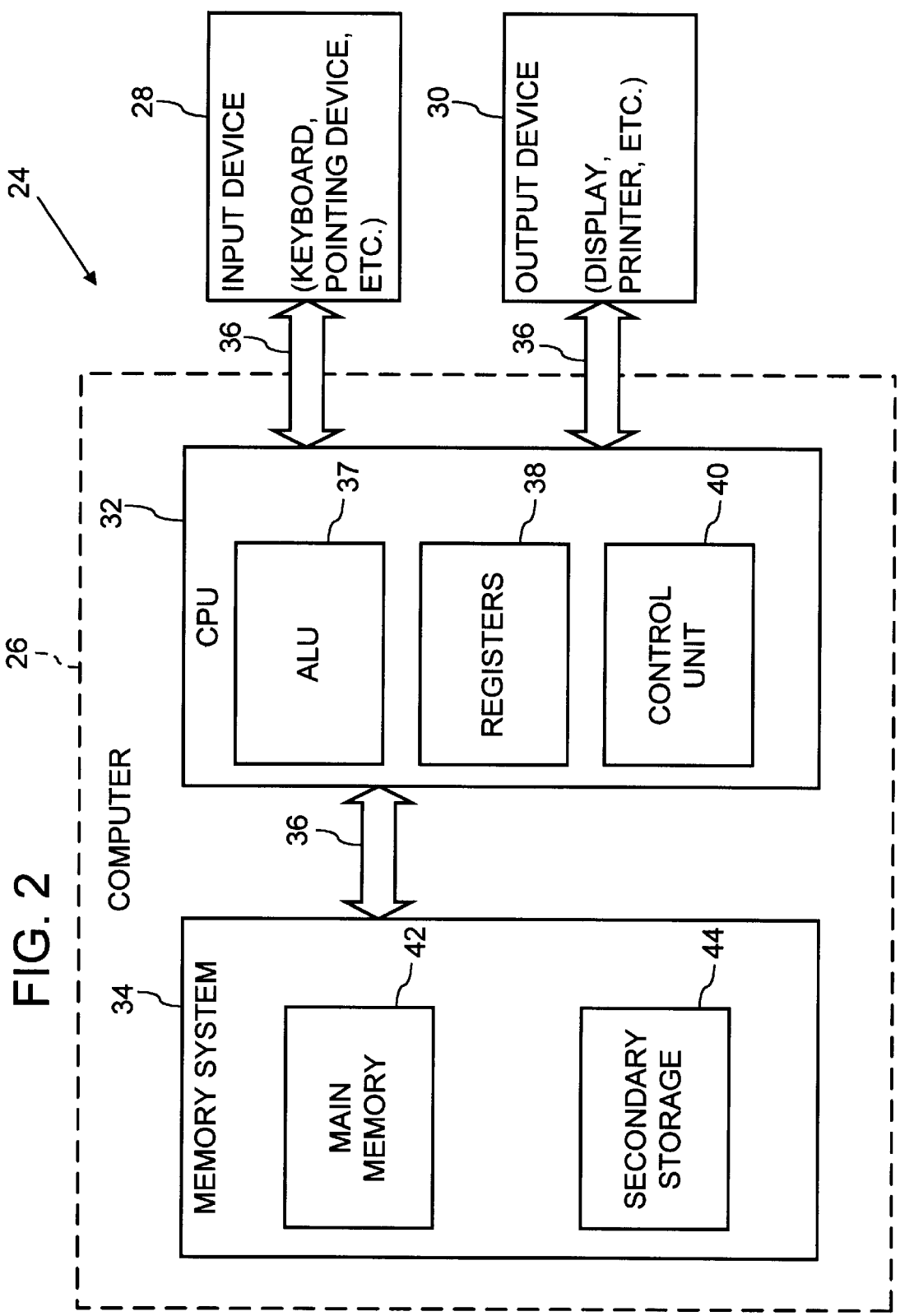

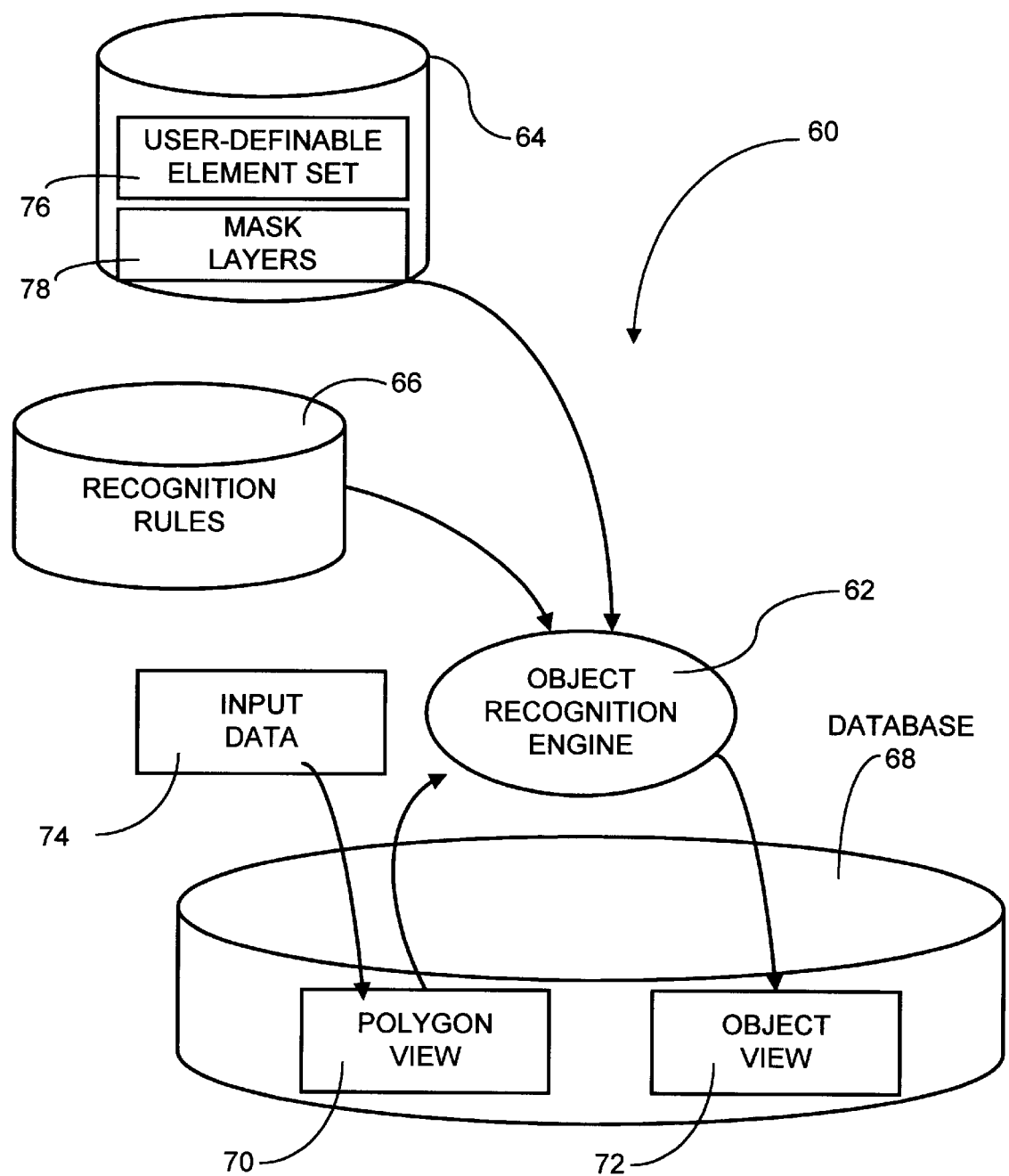

6,064,806

SYSTEM AND METHOD FOR CONVERTING A POLYGON-BASED LAYOUT OF AN INTEGRATED CIRCUIT DESIGN TO AN OBJECT-BASED LAYOUT

This application claims the benefit of U.S. Provisional Application No. 60/027,768 filed on Oct. 4, 1996.

FIELD OF THE INVENTION

This invention relates generally to integrated circuits and, more particularly, to a recognition device for converting an integrated circuit design from a polygon-based layout to an object-based layout.

BACKGROUND OF THE INVENTION

Integrated circuits (ICs) are designed today with computers using computer programs known as IC design tools. With these tools, a circuit designer enters geometrical shapes (e.g., polygons) of an IC design into a computer and manipulates the shapes to produce a simulated layout of the circuit. The geometrical shapes form circuit elements, such as transistors, resistors, capacitors, and wires. These shapes represent material in an IC on a physical layer (e.g., metal, diffusion, or polysilicon) with each material typically shown in a different color. From this simulated layout, the design tool generates data for producing photolithographic masks that are then used for fabricating the IC.

FIG. 1A shows an example of a transistor 10 represented as several overlapping polygons. The transistor includes a polysilicon layer 12 that forms a gate region 15 (shown generally in dashed lines) and a diffusion layer 14 that forms a source and drain of the transistor 10. The electronics industry has amassed a large inventory of IC designs that include polygon-based elements, such as the transistor 10. More recently, the industry is moving away from polygon-based layouts in favor of object-based layouts. An object-based layout represents circuit elements as objects, which are containers encapsulating the geometric properties of the circuit elements for each layer in the IC. Object-based layouts are preferable because related geometries on multiple layers can be grouped together into a single cohesive unit enabling devices to be manipulated at a higher level of abstraction than equivalent polygon-based layouts. Additionally, generating a netlist (i.e., a representation of a design as a list of electrical devices and their interconnections, but with limited geometrical information) is explicit in the object-based layout, rather than requiring an extraction process as in a polygon-based layout.

Recognition devices have been developed to convert the existing polygon-based layouts to object-based layouts. Current recognition devices, however, include a library of a fixed set of element types. These element types have predetermined geometries for each element. Elements that do not have the same predetermined geometries defined in the fixed set of element types cannot be recognized and, therefore, are not automatically converted into objects. FIG. 1B and 1C show common examples of transistor elements that can exist in polygon-based layouts that are typically unrecognizable by current recognition devices. FIG. 1B shows a transistor 16 similar to the transistor 10 of FIG. 1A, but with a notch 18 in the diffusion layer. FIG. 1C shows a transistor 20 with a bent gate 22. Notch 18 and bent gate 22 represent slight geometric deviations from the traditional transistor 10, shown in FIG. 1A. Such elements with geometric deviations are typically unrecognizable because they differ from the recognition device's predetermined library of element types. Often, these geometric deviations are introduced into a layout to allow for tighter compaction of elements in the IC. Of course, geometrical deviations also may exist in elements other than transistors, such as capacitors, resistors, diodes, etc.

Users are often familiar with the differences between the library of element types in current recognition devices and elements within their own polygon-based layout. Nonetheless, current recognition devices do not allow users to utilize such information. As a result, many types of elements go unrecognized so that a polygon-based layout cannot be converted automatically to an object-based layout.

Accordingly, it would be desirable to provide a recognition device for converting a polygon-based layout to an object-based layout where virtually any element can be recognized, even those with slight geometrical deviations from standard element types. It would also be desirable to provide such a recognition device that makes use of user-supplied information about element types to be used to convert the polygon-based layout.

SUMMARY OF THE INVENTION

The present invention provides a system and method for converting a polygon-based layout to an object-based layout for virtually any polygon-based device, regardless of its shape or orientation.

In one aspect of the invention, a user-definable element set allows a user to program element types that are to be recognized. A candidate element type is chosen for recognition. A seed layer corresponding to the current element type is derived from the polygon-based view. The seed layer includes seed shapes. At least one of the seed shapes is analyzed to obtain its defining attributes. The attributes are used to configure a candidate element, which is an element type from the user-definable element set. The geometries of the candidate element are compared to corresponding geometries in a support view. If the geometries of the layers of the candidate element are entirely contained within the geometries on the respective layers of the support view, then the candidate element is considered recognized. The candidate element is then added to a recognized view. This process continues for substantially all of the seed shapes in the seed layer. Other candidate elements may then be used to further convert the polygon-based view to the object-based view.

The user-definable element set allows virtually any element in a polygon-based layout to be recognized. This capability provides a distinct advantage over existing element sets that are fixed (i.e., hard-coded).

The foregoing and other objects, features, and advantages of the invention will become more apparent from the following detailed description of a preferred embodiment which proceeds with reference to the following drawings.

BRIEF DESCRIPTION OF THE DRAWINGS

FIG. 2 is a block diagram of a computer system used to convert a polygon-based layout to an object-based layout according to the invention.

FIG. 4 is a diagram of a system architecture according to the present invention.

DETAILED DESCRIPTION OF A PREFERRED EMBODIMENT

Figure 1A:
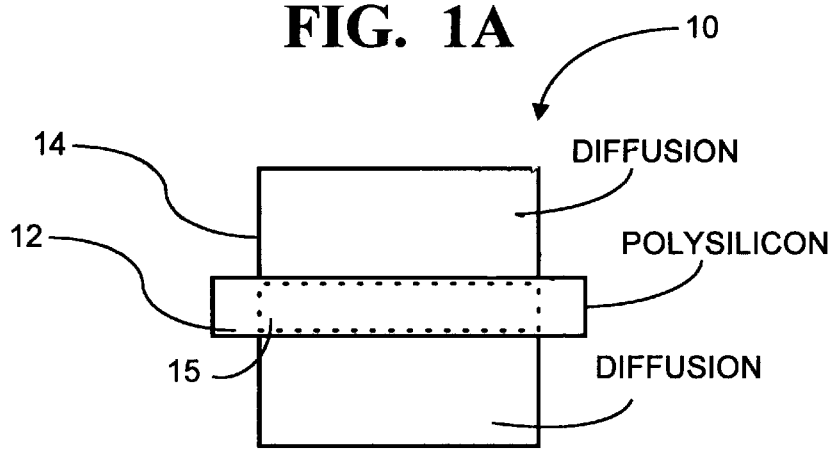
FIGS. 1A, 1B, and 1C show various transistors represented as a polygon in accordance with a polygon-based layout.
Figure 1B:
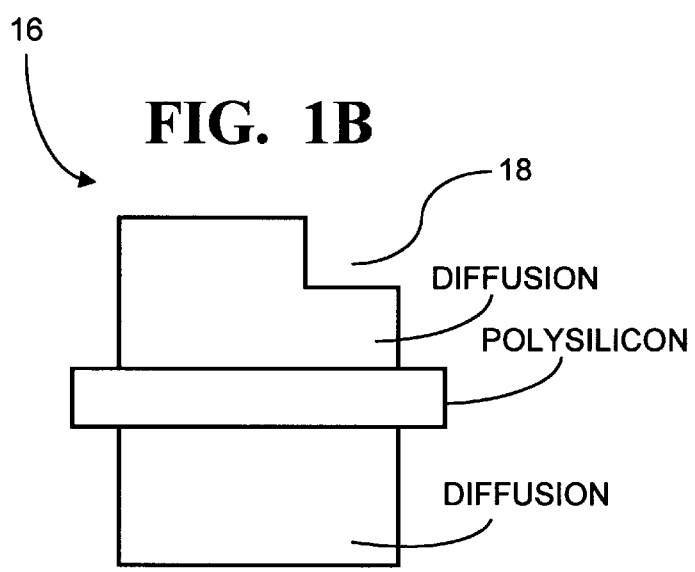
Figure 1C:
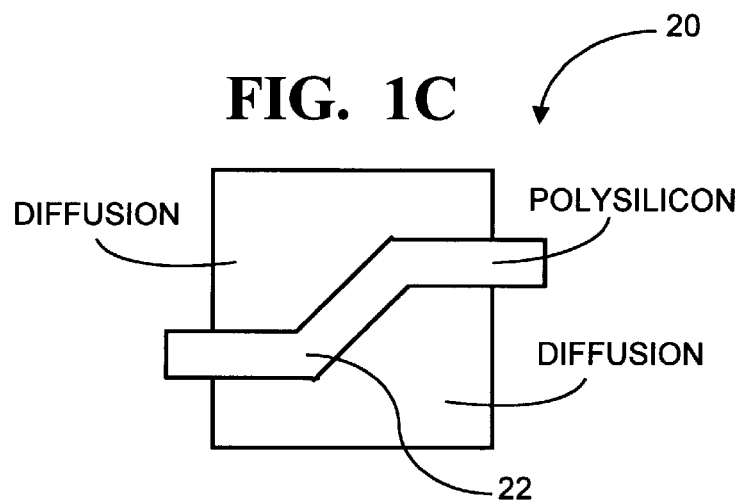

FIG. 2 is a block diagram of a computer system 24 that is used to convert a polygon-based layout of an IC design to an object-based layout embodying the invention. Computer system 24 includes as its basic elements a computer 26, input device 28 and output device 30.

Computer 26 generally includes a central processing unit (CPU) 32 and a memory system 34 that communicate through a bus structure 36. CPU 32 includes an arithmetic logic unit (ALU) 37 for performing computations, registers 38 for temporary storage of data and instructions and a control unit 40 for controlling the operation of computer system 24 in response to instructions from a computer program such as an application or an operating system.

Memory system 34 generally includes high-speed main memory 42 in the form of a medium such as random access memory (RAM) and read only memory (ROM) semiconductor devices and secondary storage 44 in the form of a medium such as floppy disks, hard disks, tape, CD-ROM, etc. and other devices that use, for example, optical or magnetic recording material. Main memory 42 stores programs such as a computer's operating system and currently running application programs. Main memory 42 also includes video display memory for displaying images through a display output device 30.

Input device 28 and output device 30 are typically peripheral devices connected by bus structure 36 to computer 26. Input device 28 may include one or more of a keyboard, modem, pointing device, pen, or other device for providing input data to the computer. Output device 30 may be a display device, printer, modem, sound device or other device or combinations of devices for providing output data from the computer. The input and output devices may be physically combined into a single device if desired.

It should be understood that FIG. 2 is a block diagram illustrating the basic elements of a computer system 24; the figure is not intended to illustrate a specific architecture for a computer system 24. For example, no particular bus structure is shown because various bus structures known in the field of computer design may be used to interconnect the elements of the computer system in a number of ways, as desired. CPU 32 may be comprised of a discrete ALU 37, registers 38, and control unit 40, or may be a single device in which these parts of the CPU are integrated together, such as in a microprocessor. Moreover, the number and arrangement of the elements of the computer system may vary from what is shown and described in ways known in the art (i.e., multiple CPUs, client-server systems, computer networking, etc.). A specific example of a computer system that may be used is a Sun SPARC station 20.

Figure 3A:
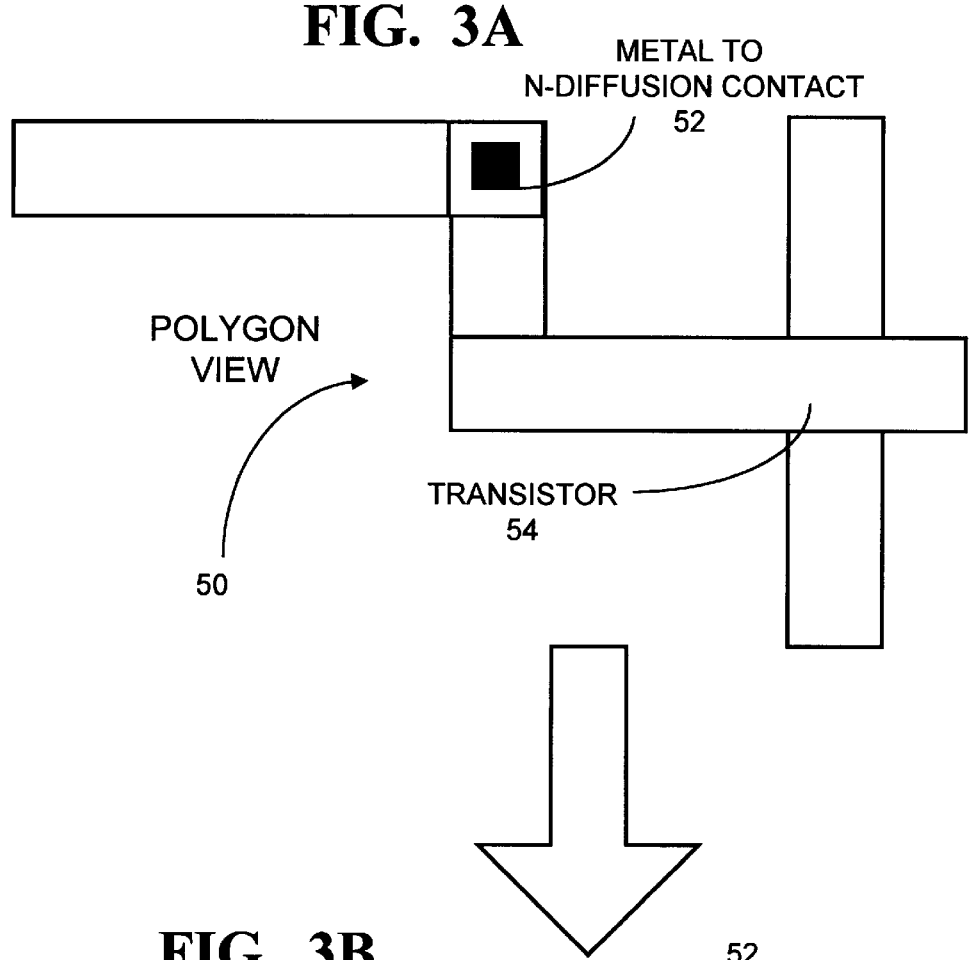
FIGS. 3A and 3B show an example of a conversion from a polygon-based layout to an object-based layout using the computer system of FIG. 2.
Figure 3B:
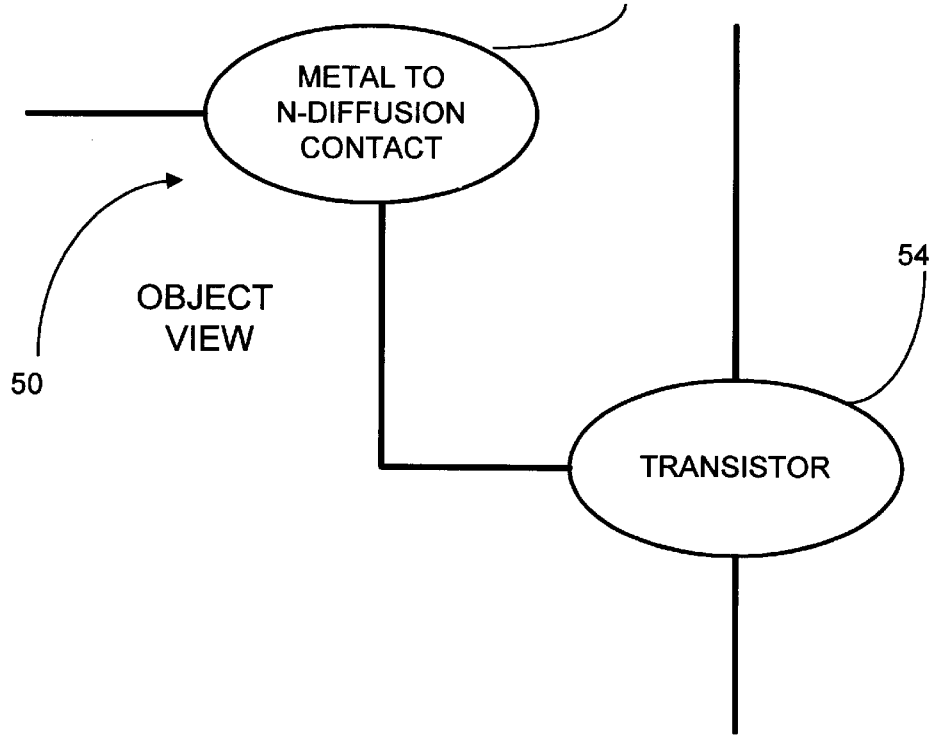

FIG. 3A shows a polygon-based view of a circuit fragment 50 including a contact 52 between a metal layer and an N-diffusion layer (called MNDIFF) and a transistor 54. FIG. 3B shows the equivalent circuit fragment 50 in an object view according to the illustrated embodiment of the invention. The polygon-view is typically in a Graphical Design System (GDS) format, such as GDSII, but the invention is equally applicable to other polygonal data formats. Each element and wire configuration in the polygon view is mapped to a electrically equivalent object (shown symbolically) to obtain the object view of FIG. 3B. Each object contains the necessary geometrical information to efficiently reconstruct the polygon view of FIG. 3A. For example, the object that represents transistor 54 may include the length and width of the transistor.

FIG. 4 shows a system architecture 60 that includes an object recognition engine 62, a technology file 64, a recognition rules file 66, and a database 68 containing a polygon view 70 and an object view 72. Input data 74 describes the polygon-based layout that is to be converted into an object-based layout. The input data 74 is typically in a GDS-based format and is read into the database 68 to form the polygon view 70.

The technology file 64 contains a user-definable element set 76. The element set 76 includes a palette of elements types (e.g., transistors, diodes, contacts, wires, etc.) that are created by the user with the help of a programming language used to define polygon-based geometries in terms of object-based device parameters. The user knows the basic geometries contained in the input data 74 to be converted and uses this information to create the element set 76. This element set may also be created by an automatic process, rather than being user definable. Thus, an analysis can be done automatically to determine the element set needed to recognize devices in a given input view. The technology file 64 also contains mask layers 78 found in the polygon-based layout (and common to the equivalent object-based layout). For example, the mask layers 78 may define the first layer to be a diffusion layer, the second layer to be a polysilicon layer, the third layer to be a metal layer, etc.

The recognition rules 66 are also user definable. The recognition rules identify a sequence of candidate elements (i.e., the candidate elements are members of the user-definable element set) and recognition statements associated with the candidate elements. The recognition statements are used to obtain attributes from seed shapes derived from the polygon-based view (e.g., the length or width of a seed shape, the relative rotation of the shape). These attributes are used to configure a candidate or exemplar element associated with the user-definable element set 76. The current candidate element is said to be "recognized" if geometries on its layers are fully contained within the geometries of the respective layers of a support view, as is further described below.

The object recognition engine 62 is a program running on computer 24. The recognition engine 62 uses the technology file 64 and responds to commands in the recognition rules 66 to convert the polygon view 70 to the object view 72 contained within the database 68. Further details of the object recognition engine and the conversion process are described below.

The database 68 is preferably a Forma® database developed by and commercially available from Mentor Graphics Corporation. Forma is an object-oriented database that allows for user-defined objects. Forma is particularly advantageous for representing IC design data. Other databases may also be used. In the Forma database, a design consists of a library containing a collection of cells. A cell can have more than one view (layout, schematic, bounding box); the appropriate view is determined by the context in which it is used. Each view holds a collection of elements. Forma supplies a generic set of built-in element types (e.g., RECTANGLE, POLYGON, PATH, TEXT, INSTANCE), and also a programmable element type, called an extensible element, which can be configured using Forma's extension language to create types specific to an IC process (e.g., NTRAN, PTRAN, M1M2). Further implementations regarding Forma and the extensible element are discussed in Matheson et al., U.S. Pat. No. 5,592,392, which is hereby incorporated by reference.

A technology in Forma defines a collection of layers, a pallet of elements, and an extensible set of attributes (name-value pairs). The names are character strings, but the attribute values can be any of a fixed set of primitive types. These types include scalar values (e.g., Float64, Angle), array values (e.g., Int32Array, String), and reference values (e.g., Elemld, Attrld), as well as an extensive collection of geometric values (e.g., Point, Rectangle, Polygon, Path) all organized as a protocol hierarchy.

Elements represent the devices and wires in a view. Unlike previous layout tools, Forma is not limited to a hard-coded element set. Instead, each view is associated with one technology defining the types of elements that can be stored in it. Elements in Forma are composed of attributes belonging to various categories (e.g., GRAPHICAL, MASKABLE, EDITABLE, DEFINING). A single element attribute may belong to several categories. Forma provides a mechanism for iterating over the attributes of an element in a particular category (or set of categories). For example, to extract all of the layout associated with an element, Forma iterates over its MASKABLE attributes. On each iteration, the current geometric primitive and its associated mask layer are used to generate the corresponding GDS-based layout in polygonal form.

Elements are also programmable objects. Element attributes that can be modified (e.g., the width of a RECTANGLE) belong to the EDITABLE category, but not all modifiable attributes are necessarily independent of each other. For example, the lowerLeftCorner attribute of a RECTANGLE can be set, potentially affecting both its length and width attributes.

The DEFINING category allows element authors to supply an orthogonal subset of EDITABLE attributes that completely characterize an element. In other words, clients can cause an element to attain any achievable configuration by setting its DEFINING attributes.

Figure 5:
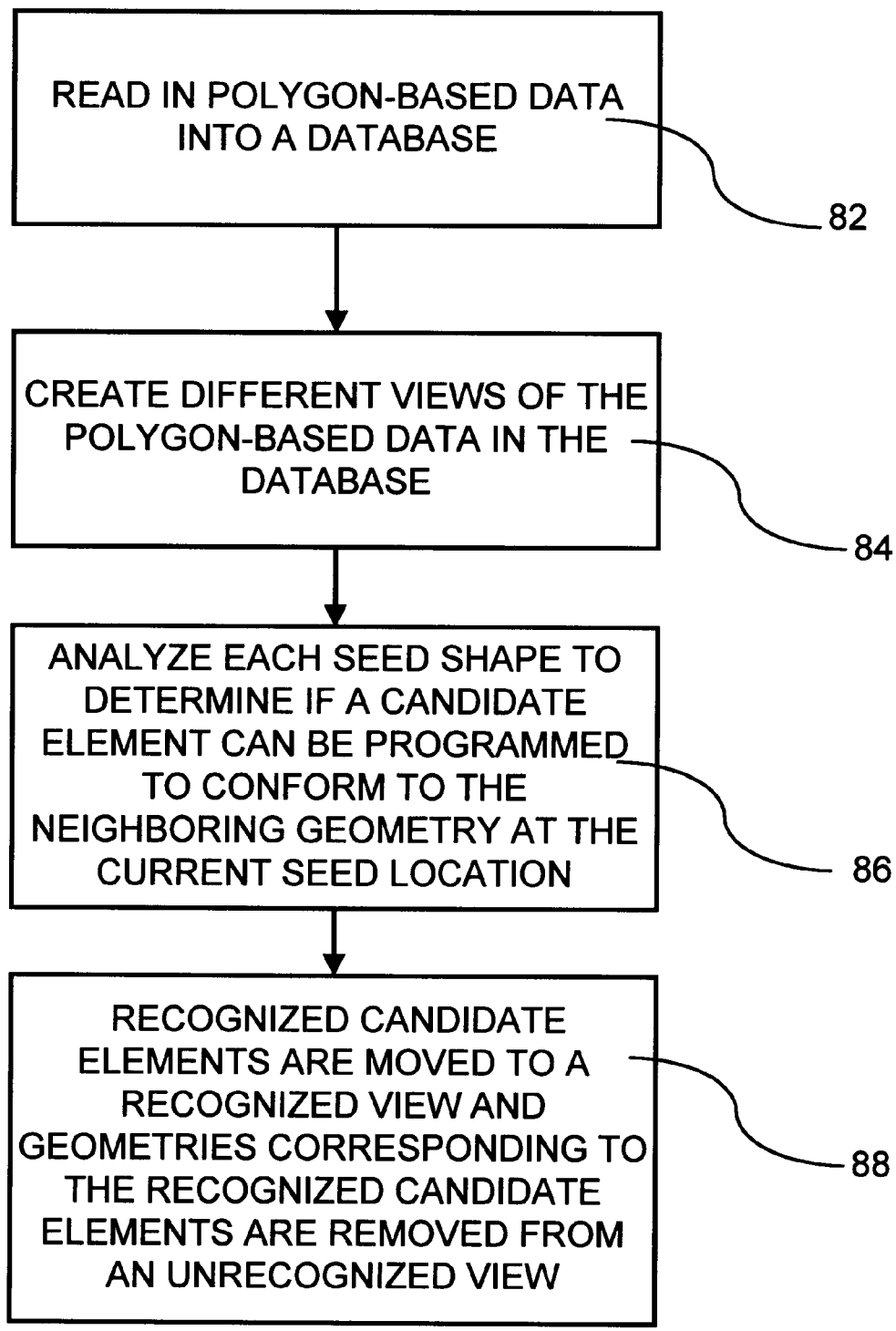
FIG. 5 is a top-level flow diagram for converting a polygon-based layout to an object-based layout using the system architecture of FIG. 4.

FIG. 5 shows a flow diagram 80 for converting a polygon-based layout to an object-based layout. In step 82, the GDS-based input data 74 (FIG. 4) is read into the Forma database 68 to create the polygon view 70.

In step 84, multiple views are created for the conversion process. The views (many of which are not shown) include the polygon view 70 (also called the unrecognized view), the object view 72 (also called the recognized view), an input view, a support view, a seed view, and an output view. As already mentioned, the polygon view contains geometrical shapes to be converted into objects. The recognized view contains objects that represent elements from the polygon view that have been recognized. At the start of the conversion process, the recognized view is void of object elements. Each time a candidate element is recognized, it is added to the recognized view. Consequently, as the conversion process continues, the number of elements in the object view grows. The unrecognized view contains merged polygon elements that are not yet recognized. When a candidate element is recognized, its corresponding geometries are removed from the respective layers of the unrecognized view. The support view is the union of the recognized and unrecognized views. The seed view is formed from Boolean mask operations that are used to logically combine different layers as defined in the recognition rules. For example, to identify all likely P-transistor gate regions in a CMOS process having mask layers of polysilicon (POLY) and p-type diffusion (PDIFF), a new layer is synthesized with geometries that are the logical AND of geometries on those layers by using the following layer definition:

LAYERDEF ptran=POLY AND PDIFF

Once defined, a synthesized layer can be used to synthesize other layers.

The seed view contains seed shapes. A current seed shape is a shape that the recognition engine 62 is analyzing. The output view is the union of the object elements from the recognized view and the geometrical shapes from the unrecognized view after the recognition process is complete.

In step 86, each seed shape on a seed layer along with its surrounding geometry is analyzed to obtain the defining attributes of the candidate element. As further described in relation to FIGS. 6 and 7, a current seed shape is analyzed by the recognition engine 62 based on the recognition rules 66. A candidate element identified in the recognition rules is configured by using the attributes deduced, inferred or obtained from the seed shape and/or its surrounding geometry. The candidate element is an element type from the element set 76. Once the recognition rules used to configure the candidate element are completed, the object recognition engine 62 is instructed to check if the geometries of the layers of the candidate element are fully contained within the geometries contained in the support view. If they are, the candidate element is recognized.

In step 88, for recognized elements, the candidate element is copied into a recognized view and geometries corresponding to the candidate element are removed from an unrecognized view.

Unrecognized elements can be examined and the user-defined element set 76 updated to ensure recognition of the process is completed. Additionally, the user-definable recognition rules can be modified to further aid in recognizing elements.

Figure 6:
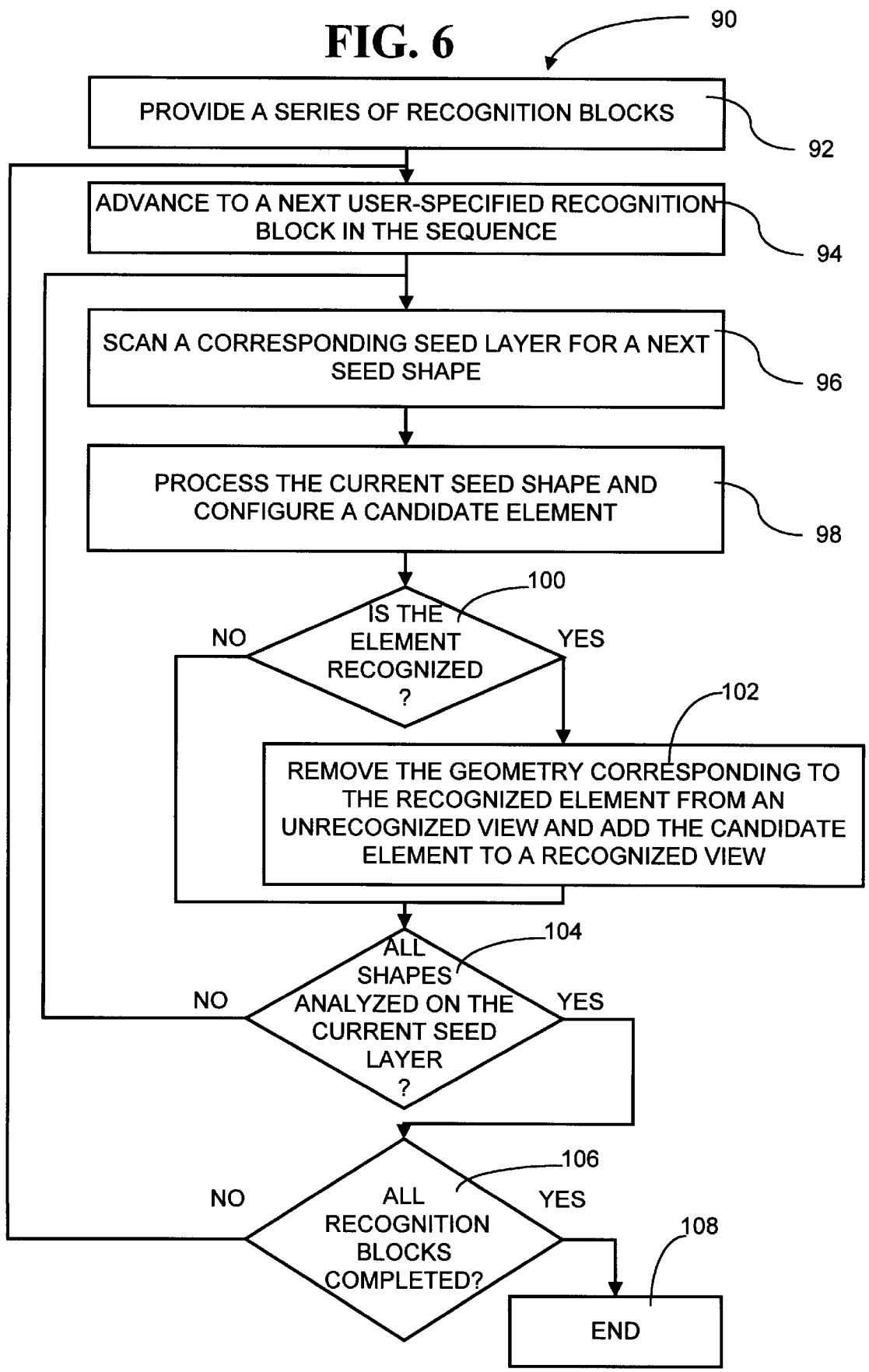
FIG. 6 is a detailed flow diagram for converting a polygon-based layout to an object-based layout, including processing a seed shape to determine if the seed shape corresponds to a candidate element.

FIG. 6 shows a flow diagram 90 providing further detail on the steps taken by the recognition engine 62. In step 92, a series of user-definable recognition blocks are provided in the recognition rules 66 (FIG. 4). A sample of the recognition rules are shown below in Table 1.

TABLE 1

LAYER DEFINITIONS ######
LAYERDEF ntran - POLY AND NDIFF
LAYERDEF ptran = POLY AND PDIFF
LAYERDEF mndift = CUTMD AND NDIFF
LAYERDEF mpdift = CUTMD AND PDIFF
LAYERDEF mnsub = CUTMD AND NDIFF1
LAYERDEF mpsub = CUTMD AND PDIFF1
CUTMP
CUTMM
LAYERDEF diff PDIFF XOR NDIFF
LAYERDEF srcdrn = diff MINUS POLY
LAYERDEF gatelr = POLY MINUS diff
DEVICE DEFINITIONS #####
FIRST RECOGNITION BLOCK #####
DEVICE TN ntran
   EDGE_LIST list = SEED_SHAPE EDGES_TOUCHING srcdrn
   EDGE edge = FIRST_EDGE_OF list
   ROTATION = ANGLE_OF edge
   width = WIDTH_OF SEED_SHAPE
   length = HEIGHT_OF SEED_SHAPE
   TRY TABLE 1-continued

```
END
SECOND RECOGNITION BLOCK #####
DEVICE TP ptran
    EDGE_LIST list = SEED_SHAPE EDGES_TOUCHING srcdrn
    EDGE edge = FIRST_EDGE_OF list
    ROTATION = ANGLE_OF edge
    width = WIDTH_OF SEED_SHAPE
    length = HEIGHT_OF SEED_SHAPE
    TRY
END
THIRD RECOGNITION BLOCK #####
DEVICE TNC ntran
    ORIGIN = ZERO_POINT
    EDGE_LIST list = SEED_SHAPE EDGES_TOUCHING gatelr
    EDGE end = FIRST_EDGE_OF list
    channel = end THIS_PATH_OF SEED_SHAPE
    TRY
END
FOURTH RECOGNITION BLOCK #####
DEVICE TPC ptran
    ORIGIN = ZERO_POINT
    EDGE_LIST list = SEED_SHAPE EDGES_TOUCHING gatelr
    EDGE end = FIRST_EDGE_OF list
    channel = end THIS_PATH_OF SEED_SHAPE
    TRY
END
```

Each layer definition (i.e., LAYERDEF) at the top of the recognition rules defines a seed layer in the seed view. For example, the "ntran" layer is a Boolean combination of the POLY and NDIFF layers (the POLY and NDIFF layers are defined by the mask layers 78 in the technology file 64 (FIG. 4)). For purposes of illustration, in table 1, there are 4 recognition blocks shown: a TN recognition block to recognize N-channel transistors; a TP recognition block to recognize P-channel transistors; a TNC recognition block to recognize complex N-channel transistors; and a TPC recognition block to recognize complex P-channel transistors. Other layer definitions and recognition blocks can be used for different element types. Each recognition block contains one or more recognition statements. The recognition statements are used to infer or obtain attributes from seed shapes and/or attributes of geometry surrounding the seed shape and configure a candidate element associated with a current recognition block based on those attributes. The recognition rules are described more fully in relation to FIG. 7, described below.

In step 94, the object recognition engine 62 advances to the next recognition block in the sequence. In the above example, the TN recognition block is the first recognition block in the sequence and is executed first. In response to the object recognition engine 62, the database 68 filters the seed view so that only seed shapes corresponding to the "ntran" layer are analyzed. The database scans the seed layer for a first seed shape (step 96). In step 98, the object recognition engine 62 processes the first seed shape and configures a candidate element based on attributes obtained from the seed shape and/or its surrounding geometry. This processing step is further described in FIG. 7. In step 100, if the candidate element is recognized, then geometries associated with the candidate element are removed from the unrecognized view. A copy of the candidate element is then added to the recognized view (step 102). If the candidate element is not recognized, then no operation is performed.

In step 104, a determination is made whether all the seeds on the current seed layer have been analyzed. If not, then steps 96 through 104 are repeated again. In other words, the same recognition block TN iterates for each seed shape on the seed layer until all of the seed shapes on that layer are analyzed.

Once all the seed shapes are analyzed, step 106 checks to see if there are any more recognition blocks in the sequence. In the above example, the "TP" recognition block is analyzed next (step 94). This time, the database 68 filters the seed layers so that only the seed shapes on the "ptran" layer are analyzed. The object recognition engine 62 then analyzes each seed shape on the ptran layer in order to recognize p-channel elements.

This process continues until all of the recognition blocks are completed (step 108). At this point, a copies of the unrecognized polygon-based elements from the unrecognized view and the objects from the recognized view are merged into the output view.

Figure 7:
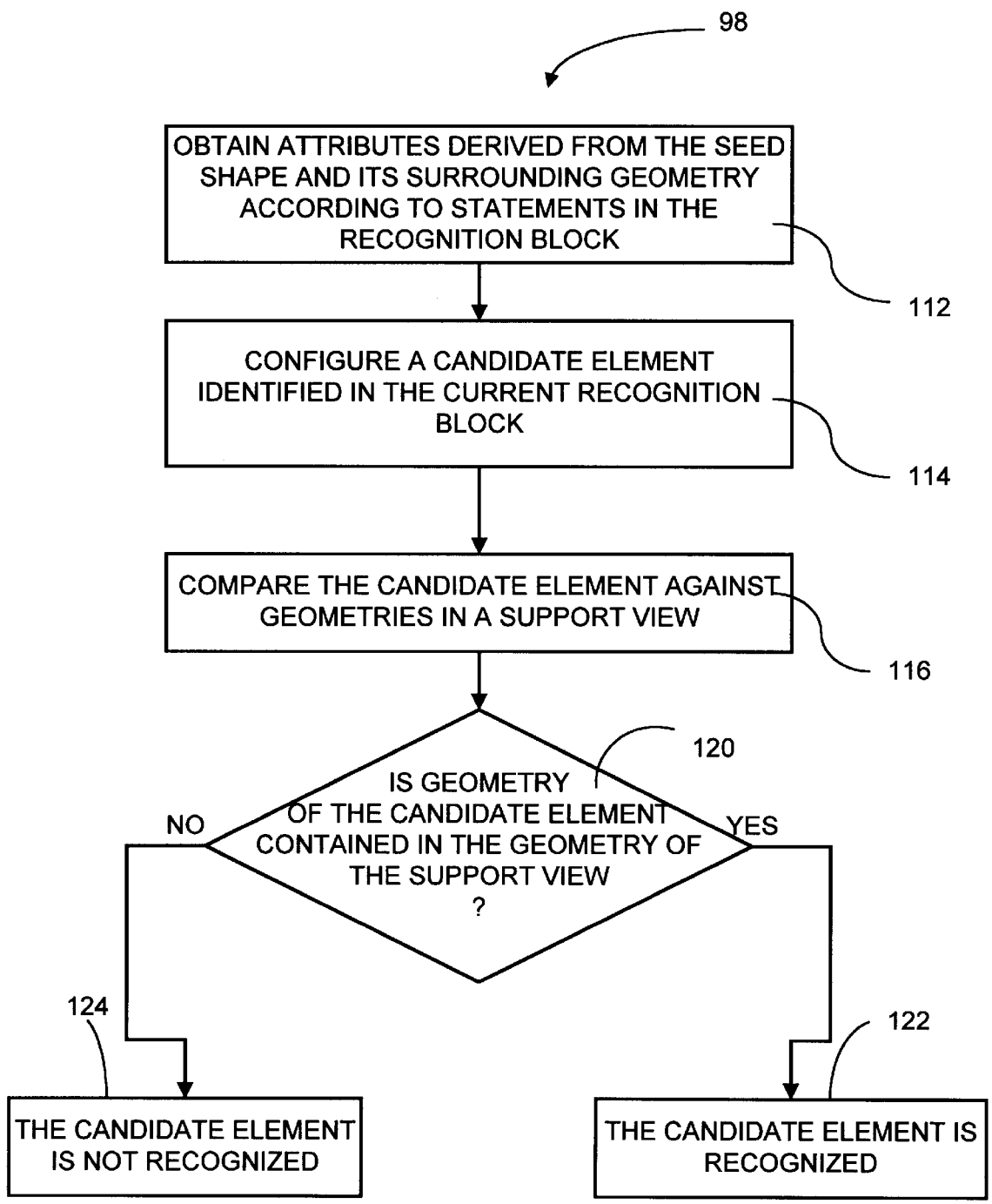
FIG. 7 is a detailed flow diagram of the processing step of FIG. 6.

FIG. 7 is a flow diagram of the process step 98 of FIG. 6. The steps of FIG. 7 will be described with reference to the first recognition block TN in table 1. The other recognition blocks behave similarly. In step 112, a current seed shape is analyzed by obtaining attributes for the candidate element. For instance, returning to the above example, the recognition statement "width=WIDTH_OF SEED_SHAPE" obtains the width of the seed shape and places that value in the width attribute of the candidate element. Similarly, the "length" attribute obtains the length of the seed shape. The surrounding geometry may also be taken into consideration. For example, the recognition statement "EDGE edge=FIRST_EDGE_OF list" obtains an edge where the current seed shape touches the source and drain region on the "srcdrn" (diff MINUS POLY layer). Since the recognition blocks are programmable, the user has control over how each seed shape is to be analyzed. In step 114, a candidate element having a type TN is configured (step 112). The candidate element was originally instantiated from the user-definable element set 76. The type TN is chosen in step 94 because that is the type identified on the first line of the current recognition block. The attributes obtained in step 112 are applied to the candidate element. In step 116 and 120, at the end of the recognition block the command "TRY" causes the geometries on the layers forming the candidate element to be compared to geometries on corresponding layers in the support view. This comparison is a Boolean operation to see that the geometries of the candidate element are fully contained in the geometries of the support view. If they are, the candidate element is said to "match" the support view. In step 122, if the candidate element matches the support view, then the candidate element is recognized. If the candidate element does not match, then it is not recognized (step 124).

Table 2, shown below, provides a set of recognition statements for use in the illustrated embodiments of this invention.

TABLE 2

| Command | Description |
| --- | --- |
| ZERO ANGLE | Return the zero value of an angle as an Angle. |
| ZERO_POINT | Return the zero value of a point as a Point. |
| ANGLE_OF ...Edge | Return the angle of the specified Edge as an Angle. |
| HEIGHT_OF WIDTH_OF ...Polygon | Return the height/width of the bounding box of the specified Polygon as an Int. |
| CENTER_OF ...Polygon | Return the center of the bounding box of the specified Polygon as a Point. |
| PATH_OF ...Polygon | Return the equivalent path-based representation of the specified Polygon as a Path; exit recognition block if no Path is found. |
| FIRST_EDGE_OF ...EdgeList | Return the first edge in the specified EdgeList as an Edge; exit recognition block if EdgeList is empty. |

TABLE 2-continued

| Command | Description |
| --- | --- |
| EDGES_TOUCHING<br>...Polygon<br>...Layer | Return the set of edges touch the specified Polygon on the specified Layer as an EdgeList. |
| TRY | Attempt to match the current configuration of the element with the geometry in the vicinity of the seed shape. if match, extract device and exit recognition block; otherwise, continue with next statement in block. |

Recognizing an element requires gathering information from the current (seed) context in order to set appropriately the DEFINING attributes of the candidate element. The variables and commands used to accomplish this task are specified within the recognition block(s) associated with that element. The recognition engine supports a set of scalar and geometric types that roughly correspond to the primitive attribute types in Forma (such as integers, angles, points, edges, polygons, paths) along with a set of built-in geometric operations as set forth above to facilitate the recognition process. When a recognition block is entered, the engine immediately creates local variables corresponding to the DEFINING attributes for that element. Certain attributes (e.g., an origin) are common to all geometric elements, and every geometric element can be transformed (i.e., moved rotated, and reflected). It is not uncommon for multi-layer elements representing electrical devices to contain an affine transformation attribute of type Xfm whose value describes its current transformation. By contrast, simple geometric elements (e.g, POLYGON and PATH) do not retain a transform value; instead, they are immediately transformed to their new configuration.

The object recognition engine defines three special variables: ORIGIN, ROTATION, and REFLECTION; their values specify the location and orientation at which to TRY an element, and must be determined along with those of the DEFINING attributes. The initial value of ORIGIN is the center of a bounding box of the seed shape. Both ROTATION, and REFLECTION are initially zero. Assigning a non-zero value to ROTATION has the side effect of normalizing subsequent commands in the recognition block, which in turn simplifies the recognition process.

To determine the orientation of the device, an edge of the gate region adjacent to either the source or drain diffusion regions is identified; the angle of that edge defines the rotation of the device. Assigning the angle of this edge to the ROTATION variable normalizes the device; the results of all future queries are inverse-transformed so that the device to be recognized appears unrotated.

The order in which recognition blocks are specified may be significant. For example, path-based elements capable of matching the geometries of bent-gate transistors are also capable of matching those of conventional ones (e.g., TN). Preferably, the recognition block for the simpler element is placed ahead of the block for the more complex one, which typically results in a more efficient representation of the device.

Having illustrated and described the principles of the invention in a preferred embodiment, it should be apparent to those skilled in the art that the preferred embodiment can be modified in arrangement and detail without departing from such principles.

For example, although multiple views are described, such as a polygon view, support view, recognized view, etc., the number of views used can be modified so that less or more views are used to carry out the recognition process.

Additionally, although examples shown herein focused on transistors as an element to be recognized, the invention can recognize any type of element including but not limited to diodes, cuts, wires, capacitors, resistors, vias or other circuit components known in the art.

Still further, although the illustrated embodiment is directed to elements, the invention can equally apply to recognizing any geometrical shapes, and converting those shapes to an object-based equivalent.

In view of the many possible embodiments to which the principles of the invention may be applied, it should be recognized that the illustrated embodiment is only a preferred example of the invention and should not be taken as a limitation on the scope of the following claims. The steps described in a claim can be taken in any sequence unless their order is specified. We claim as the invention all that comes within the scope of these claims.

We claim:

1. A method of converting a polygon-based layout to an object-based layout in an integrated circuit design, the method comprising the steps of:

providing a polygon view having multiple layers of geometries representing the integrated circuit;

providing an element set, the element set defining element types at least one of which is user-definable, the element types being associated with integrated circuit components;

creating a seed layer that is a logical combination of at least two of the multiple layers of geometries in the polygon view, the seed layer having seed shapes associated with circuit components in the integrated circuit;

locating a first seed shape in the seed layer having a polygon-based geometry;

analyzing the first seed shape to obtain attributes therefrom; and creating an object-based candidate using the attributes obtained from the seed shape, the candidate element being of a user-definable type defined in the element set.

2. The method of claim 1, further including comparing geometries of the candidate element against geometries associated with the polygon-based layout.

3. The method of claim 2, further including recognizing a candidate element if the geometries of the candidate element are fully contained within the geometries associated with the polygon-based layout.

4. The method of claim 3, further including adding the candidate element to a recognized view if the candidate element is recognized.

5. The method of claim 1, wherein at least one of the attributes obtained from the seed shape is a length of the seed shape and another of the attributes is a width of the seed shape.

6. The method of claim 3, further including:

providing an unrecognized view including polygon-based shapes;

providing a recognized view including object-based elements that have been recognized; and for recognized candidate elements, removing geometries associated with the candidate element from the unrecognized view and adding the candidate element to the recognized view.

7. The method of claim 1, wherein the object-based candidate element encapsulates the geometric properties of the corresponding polygon-based shapes.

8. The method of claim 1, wherein the element to be recognized is selected from a group consisting of transistors, capacitors, diodes, resistors, contacts, cuts, vias, and combinations thereof.

9. The method of claim 1, further including reading recognition rules and obtaining the attributes of the first seed shape in response to the recognition rules.

10. The method of claim 1, further including reading an input file containing a polygon-based layout into a database and forming a polygon view therefrom.

11. The method of claim 1, wherein the integrated circuit design includes multiple layers and the method further includes forming a seed layer containing seed shapes to be analyzed, wherein the seed layer is a logical combination of other layers in the integrated circuit design.

12. The method of claim 11, further including providing a plurality of recognition blocks, each block for creating a candidate element of a different element type.

13. The method of claim 12, locating the seed shapes on a seed layer and applying a recognition block to the seed shapes.

14. The method of claim 1, wherein the element set includes extensible elements that are programmable by a user.

15. The method of claim 1, wherein all element types in the element set are user definable.

16. The method of claim 1, wherein some of the element types are automatically defined.

17. A computer system for converting a polygon-based layout view of an integrated circuit design to an object-based layout view, comprising:

a computer including one or more central processing units and memory;

a polygon-based layout view of an integrated circuit stored in memory, the polygon-based layout view including polygon-based shapes representing components of the integrated circuit;

an element set stored in memory on the computer, the element set including programmable objects at least one of which is user-definable, the programmable objects being associated with components of the integrated circuit to be recognized;

a recognition block comprising user-definable recognition statements stored on the computer; and an object recognition engine stored in memory on the computer and executed by the central processing unit, the recognition engine for converting the polygon-based layout to an object based layout by reading attributes from a polygon-based shape in accordance with the recognition statements, applying the attributes to a candidate element which is associated with a particular member of the user-definable element set, and determining if the resultant candidate element is recognized.

18. A method of converting a polygon-based layout to an object-based layout in an integrated circuit design, the method comprising the steps of:

(a) providing an element set including element types that define polygon-based geometries in terms of object-based device parameters, wherein at least one element type is user definable;

(b) creating a seed layer that is derived from the polygon-based layout, the seed layer including seed shapes having geometrical attributes associated therewith;

(c) creating an object-based candidate element that is a user-definable element type from the element set;

(d) locating at least one seed shape on the seed layer;

(e) analyzing the located seed shape to obtain its geometrical attributes; and (f) applying information deduced from the geometrical attributes obtained from the located seed shape to configure the object-based candidate element.

19. The method of claim 18 further including:

providing a derived view that is associated with the polygon-based layout;

comparing geometries of the configured object-based candidate element to corresponding geometries in the derived view; and determining if the geometries of the candidate element are contained within the corresponding geometries of the derived view.

20. The method of claim 19 further including:

providing an unrecognized view including polygon-based shapes;

providing a recognized view including object-based elements that have been recognized; and if the geometries of the candidate element are contained within the corresponding geometries of the derived view, copying the candidate element into the recognized view.

21. The method of claim 20 wherein the derived view is a support view containing a union of the unrecognized view and the recognized view.

22. The method of claim 19 further wherein the locating step includes locating each seed shape on the seed layer and performing steps (e) and (f) for each seed shape.

23. A method of converting a polygon-based layout to an object-based layout in an integrated circuit design, the method comprising the steps of:

providing an element set defining element types, wherein at least one element type is user definable;

creating an unrecognized view in a database including multiple layers of geometries associated with electrical devices;

creating a recognized view in the database for storing objects that represent the electrical devices;

providing recognition statements for describing how to analyze the geometries from the unrecognized view;

in response to the recognition statements, creating a seed layer that is a logical combination of the multiple layers of geometries;

in response to the recognition statements, creating an object-based candidate element of a user-definable element type from the element set;

locating a seed shape on the seed layer;

analyzing the seed shape to obtain its attributes;

applying information deduced from the attributes obtained from the seed shape to configure the candidate element, the candidate element having geometries associated therewith;

removing geometries corresponding to the configured candidate element from the unrecognized view; and copying the candidate element into the recognized view.

* * * * *